(12) United States Patent
Yoshikawa (10) Patent No.: US 6,287,752 B1
(45) Date of Patent: Sep. 11, 2001

(54) SEMICONDUCTOR DEVICE, METHOD OF MANUFACTURING A SEMICONDUCTOR DEVICE, AND METHOD OF FORMING A PATTERN FOR SEMICONDUCTOR DEVICE

(75) Inventor: Kazunori Yoshikawa, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/359,434

(22) Filed: Jul. 22, 1999

(30) Foreign Application Priority Data

Feb. 12, 1999 (JP) .................................................. 11-034290

(51) Int. Cl.⁷ ........................................................ G03F 7/40
(52) U.S. Cl. .......................... 430/323; 430/313; 438/396; 438/952; 216/72
(58) Field of Search .............................. 216/72; 430/313, 430/316, 323; 438/952, 396

(56) References Cited

U.S. PATENT DOCUMENTS 4,180,432 * 12/1979 Clark ..................................... 156/643
6,080,680 * 6/2000 Lee et al. ............................. 438/727
6,083,815 * 7/2000 Tsai et al. ............................ 438/585

FOREIGN PATENT DOCUMENTS 4-56135   2/1992   (JP) .

* cited by examiner

Primary Examiner—Rosemary E. Ashton
(74) Attorney, Agent, or Firm—McDermott, Will & Emery (57) ABSTRACT

A resist pattern is formed on stacked first and second conductive films. After second conductive film is patterned, the patterning of first conductive film follows without removing the remaining resist pattern. Resist pattern is completely removed by etching before the patterning of first conductive film is completed. Thereafter, etching is continued using second conductive film as a mask, and the patterning of first conductive film is completed. Thus, a method of forming a pattern for the semiconductor device in which minute interconnection pattern having a stacked structure is formed without an increase in the number of processing steps can be provided.

10 Claims, 12 Drawing Sheets

SEMICONDUCTOR DEVICE, METHOD OF MANUFACTURING A SEMICONDUCTOR DEVICE, AND METHOD OF FORMING A PATTERN FOR SEMICONDUCTOR DEVICE

BACKGROUND OF THE INVENTION

1. Field of the Invention

The present invention relates to a method of forming a pattern for a semiconductor device, and more specifically, to a method of forming a pattern from stacked films.

2. Description of the Background Art

A method of forming an interconnection pattern for a conventional semiconductor device will be described below.

Figure 19:
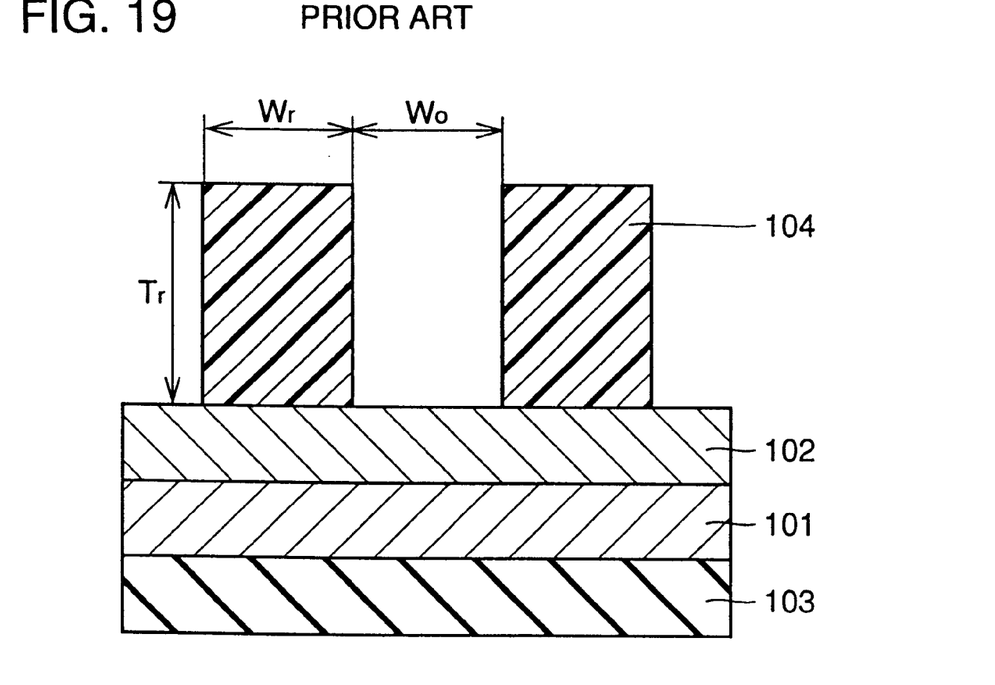
FIGS. 19 to 21 are schematic cross sectional views showing, in order, the steps involved in the method of forming an interconnection pattern for a conventional semiconductor device.
Figure 20:
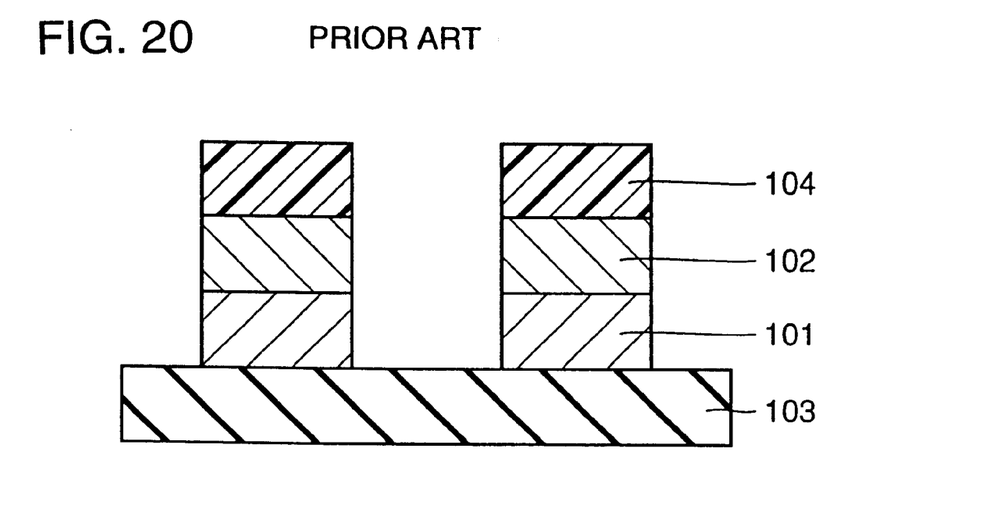
Figure 21:
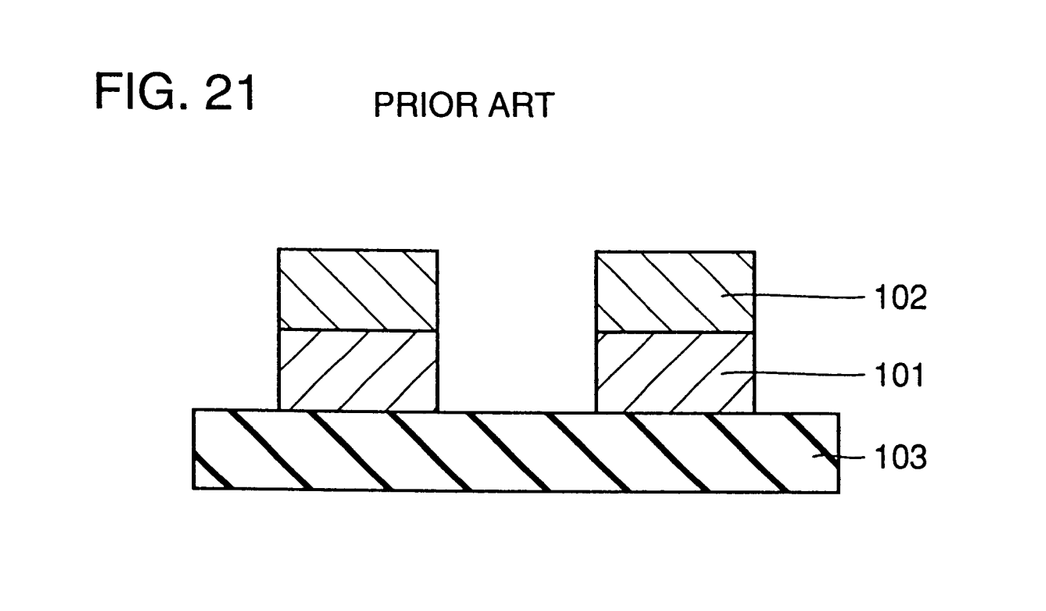

FIGS. 19 to 21 are schematic cross sectional views showing, in order, the steps involved in the method of forming an interconnection pattern for a conventional semiconductor device. In FIG. 19, a first conductive film 101 and a second conductive film 102 are stacked in this order on an insulating film 103. A resist pattern 104 is formed on a prescribed region of second conductive film 102 by a common photolithographic technique.

Insulating film 103 is formed, for example, of silicon oxide ($SiO_2$), first conductive film 101 is formed of titanium (Ti) or titanium nitride (TiN), and second conductive film 102 is formed of aluminum (Al). Moreover, first conductive film 101 is formed as barrier metal to suppress the chemical reaction between insulating film 103 and second conductive film 102, and second conductive film 102 is formed as a main electrical conduction layer.

An example of the thickness for the films is 100 nm for first conductive film 101, 100 nm for second conductive film 102, and 500 nm for resist pattern 104.

Then, second conductive film 102 and first conductive film 101 are etched in this order using resist pattern 104 as a mask.

As seen in FIG. 20, as a result of etching, second conductive film 102 and first conductive film 101 are patterned in this order, while resist pattern 104 remains on second conductive film 102.

One example of etching conditions for these films 101 and 102 when an ICP (Inductively Coupled Plasma)-type etching device is used is as follows:

Etching gas and its flow rate: $Cl_2/BCl_3/CF_4$=80/20/20 sccm (sccm representing a volumetric flow ($cm^3$/min) in a normal state);

Normal pressure: 15 mTorr;

Source power: 700 W; and

Bias power: 60 W.

With these conditions, the etch selectivity of first conductive film 101 or second conductive film 102 to resist pattern 104 (etched amount of first conductive film 101 or second conductive film 102/etched amount of resist pattern 104) is approximately 0.5 to approximately 0.8. Therefore, with the above conditions, a thickness of at least about 500 nm is required for resist 104.

Thereafter, resist pattern 104 is removed, an upper surface of second conductive film 102 is exposed as seen in FIG. 21, and the patterning of interconnection is complete.

As higher degrees of integration is achieved in semiconductor devices, the width and spacing of interconnection is becoming smaller. An accurate transfer of a resist pattern is necessary for the formation of such minute interconnection. As the pattern gets smaller, however, the interconnection width also is reduced in size so that the aspect ratio of the resist pattern becomes greater. Thus, in FIG. 19, as interconnection width Wr and interconnection spacing Wo become smaller due to miniaturization, the aspect ratio given by thickness Tr of resist pattern 104/width Wr (or Wo) becomes larger. Thus, as resist pattern 104 becomes long and narrow, resist pattern 104 may fall to the side, and as the spacing between resist pattern 104 gets narrower, the pattern may stick together.

In order to prevent such problems from occurring, either of the two following approaches must be employed: either the aspect ratio of resist pattern 104 must be reduced, or etching of interconnection must be performed using a hard mask. The method of using a hard mask involves etching the hard mask formed on an interconnection layer using a resist pattern as a mask, and after removing the resist pattern by ashing, patterning the interconnection using the patterned hard mask as a mask.

The former approach, however, in view of the reduced interconnection width and spacing due to the higher degree of integration of semiconductor devices, cannot be used with the conventional method of forming an interconnection pattern. The latter approach, on the other hand, has the problem of a great increase in the number of steps involved in processing the hard mask.

SUMMARY OF THE INVENTION

One object of the present invention is to provide a semiconductor device, a method of manufacturing the semiconductor device, and a method of forming a pattern for the semiconductor device in which minute interconnection pattern having a stacked structure is formed without an increase in the number of processing steps.

The semiconductor device according to the present invention is provided with a semiconductor substrate, a first film, and a second film. The semiconductor substrate has a main surface. The first film is formed on the main surface of the semiconductor substrate and is patterned to have a first side surface. The second film is formed on the first film, and is made of a material different from that of the first film. The second film is patterned to have a second side surface which together with a first side surface of the first film forms a side surface of a pattern. The second film has an upper surface processed by etching.

The method of manufacturing the semiconductor device according to the present invention includes the steps described below.

First, a semiconductor substrate having a main surface is formed, and a first film and a second film made of different materials in this order are stacked on the semiconductor substrate. Then, a resist pattern is formed on the second film. Thereafter, the second film is patterned by etching using the resist pattern as a mask to expose a surface of the first film selectively, while the resist pattern on the patterned second film remains. Then, the exposed first film is etched to remove the remaining resist pattern completely before the patterning of the first film is completed.

The method of forming a pattern for the semiconductor device according to the present invention includes the steps described below.

First, a first film and a second film made of different materials in this order are stacked. Then, a resist pattern is formed on the second film. Thereafter, the second film is patterned by etching using the resist pattern as a mask to expose a surface of the first film selectively, while the resist pattern on the patterned second film remains. Then, the exposed first film is etched to remove the remaining resist pattern completely before the patterning of the first film is completed.

In the present semiconductor device, the method of manufacturing the semiconductor device, and the method of forming a pattern for the semiconductor device according to the present invention, the resist pattern is removed completely during the etching of the first film before the first film is fully patterned so that there is no need to remove the resist pattern by ashing. Thus, the step of ashing to remove the resist pattern can be eliminated, thereby simplifying the manufacturing steps.

In addition, the film thickness of the resist is set so that the resist will be completely removed by etching during the patterning of the first film. The thickness of the resist here must be smaller than the thickness of the resist in the conventional example in which the resist remains even after the patterning of the first film is completed. Since the film thickness of the resist is set to be thinner than that in the conventional example, the increase in the aspect ratio of the resist can be prevented. Therefore, the resist is kept from falling to the side and the pattern can be prevented from sticking together.

Moreover, since the first film and the second film are made of different materials, a large etch selectivity of the first film to the second film during the patterning of the first film is ensured. Consequently, the second film functions as a mask even when the resist pattern is completely removed in the midst of the patterning of the first film. Thus, the first film can be patterned with a favorable result.

The above-described method of forming a pattern for the semiconductor device preferably further includes the step of forming an anti-reflection film between the second film and the resist pattern, and the step of patterning the anti-reflection film by etching using the resist pattern as a mask. The anti-reflection film is completely removed by etching the first film after the patterning of the second film before the completion of patterning of the first film.

The anti-reflection film prevents the reflection of the exposure light beam radiated upon resist exposure, thereby allowing an accurate transfer of the pattern onto the resist.

In the above-described method of forming a pattern for the semiconductor device, the etch selectivity of the first film to the second film in the patterning conditions for the first film preferably is at least 30.

Thus, the complete removal of the second film during the patterning of the first film is prevented.

The above-described method of forming a pattern for the semiconductor device preferably further includes the step of forming, between the second film and the resist pattern, a third film made of a material different from the materials of the first and second films, and the step of patterning the third film by etching using the resist pattern as a mask. The third film remains on the second film upon the completion of the patterning of the first film.

Thus, the three layers of stacked films can be patterned in a small number of steps while the resist is kept from falling to the side and the pattern is prevented from sticking together.

The above-described method of forming a pattern for the semiconductor device preferably further includes the step of forming an anti-reflection film between the third film and the resist pattern, and the step of patterning the anti-reflection film by etching using the resist pattern as a mask. The anti-reflection film is completely removed by etching the first film after the patterning of the second film before the completion of patterning of the first film.

The anti-reflection film prevents the reflection of the exposure light beam radiated upon resist exposure, thereby allowing an accurate transfer of the pattern onto the resist.

In the above-described method of forming a pattern for the semiconductor device, the etch selectivity of the first film to the third film in the patterning conditions for the first film preferably is at least 30.

Thus, the complete removal of the second and third films during the patterning of the first film is prevented.

In the above-described method of forming a pattern for the semiconductor device, the first and second films preferably are conductive films.

Thus, the stacked conductive films can be patterned in a small number of steps while the resist pattern is kept from falling to the side.

In the above-described method of forming a pattern for the semiconductor device, the third film preferably is an insulating film.

Thus, the stacked films including an insulating film can be patterned in a small number of steps while the resist is kept from falling to the side.

Preferably, in the above-described method of forming a pattern for the semiconductor device, the thickness Tr of the resist pattern formed is set such that $$Ts/S1 < Tr < Ts/S1 + Tf/S2$$

where Ts is the film thickness of the second film when it is first formed, Tf is the film thickness of the portion of the first film exposed upon the completion of the patterning of the second film, S1 is the etch selectivity of the second film to the resist pattern in the etching conditions at the patterning of the second film, and S2 is the etch selectivity of the first film to the resist pattern in the etching conditions at the patterning of the first film.

By setting the film thickness of the resist in the above-described manner, the resist pattern is completely removed in the midst of the patterning of the second film so that there is no need to remove the resist pattern by ashing, and the manufacturing steps are simplified.

Further, since the film thickness of the resist thus set is thinner than that in the conventional example, the aspect ratio of the resist can be prevented from increasing, the resist is kept from falling to the side and the pattern is prevented from sticking together.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiments of the present invention will be described below with reference to the drawings.

First Embodiment

Figure 1:
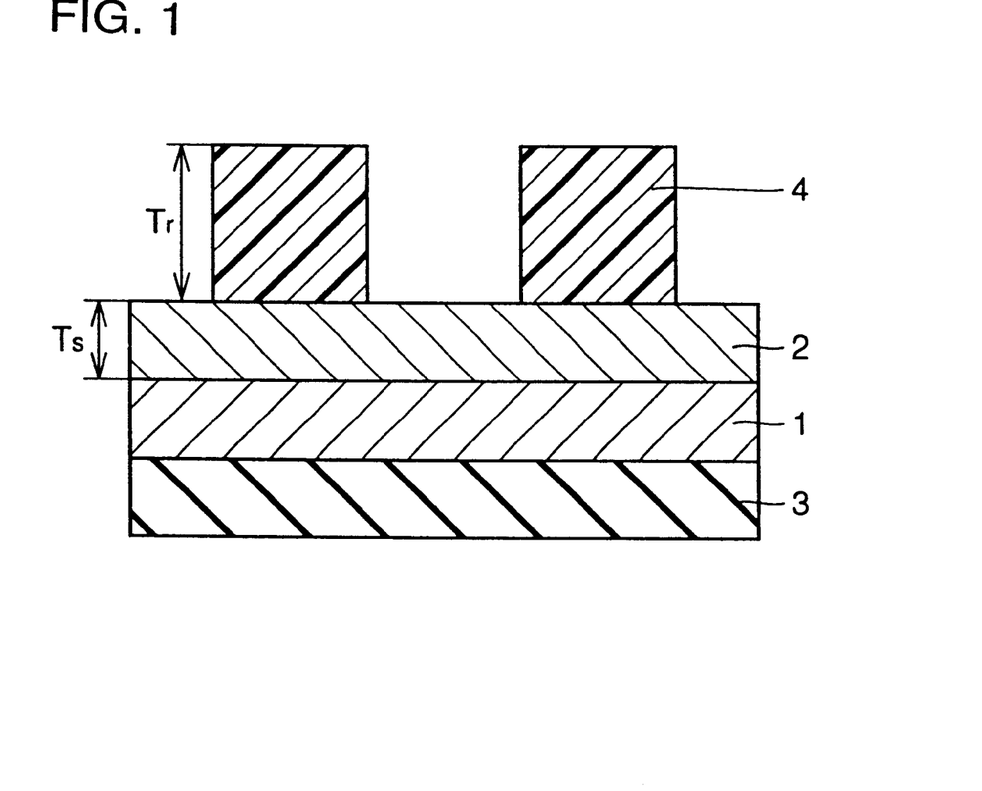
FIGS. 1 to 4 are schematic cross sectional views showing, in order, the steps involved in the method of forming an interconnection pattern for a semiconductor device according to the first embodiment of the present invention.

In FIG. 1, a first conductive film 1 and a second conductive film 2 are stacked in this order on an insulating film 3. Thereafter, a resist pattern 4 is formed on a prescribed region of second conductive film 2 by a common photolithographic technique.

Here, the materials for first and second conductive films 1 and 2 are chosen such that the etch selectivity of first conductive film 1 to second conductive film 2 (etched amount of first conductive film 1/etched amount of second conductive film 2) in the etching conditions for the patterning of first conductive film 1 is high. For instance, titanium (Ti) or titanium nitride (TiN) is used for first conductive film 1, and tungsten (W) is used for second conductive film 2. While Ti and TiN are etched by a chlorine-type gas, W is etched by a fluorine-type gas so that the etch selectivity can be made as high as about 30 to about 50. Moreover, as in the conventional example, first conductive film 1 is formed, for example, as a barrier metal layer, and second conductive film 2 is formed, for example, as a main electrical conduction film.

Furthermore, insulating film 3 is formed, for example, of silicon oxide ($SiO_2$) or the like. For instance, insulating film 3 is 100 nm in thickness, first conductive film 1 is 100 nm in thickness, second conductive film 2 is 100 nm in thickness, and resist pattern 4 is 150 nm in thickness. Here, the film thickness for resist pattern 4 is chosen such that resist pattern 4 is removed completely during etching for the patterning of first conductive film 1.

Second conductive film 2 is etched using resist pattern 4 as a mask. One example of the etching conditions for second conductive film 2 when the ICP-type etching device is used is as follows:

Etching gas and its flow rate: $SF_6/N_2/CF_4$=90/10/20 sccm (sccm representing a volumetric flow ($cm^3$/min) in a normal state);
Normal pressure: 15 mTorr;
Source power: 1000 W; and
Bias power: 40 W.

With these etching conditions, the etch selectivity of second conductive film 2 to resist pattern 4 (etched amount of second conductive film 2/etched amount of resist pattern 4) is approximately 1 to approximately 1.5.

Figure 2:
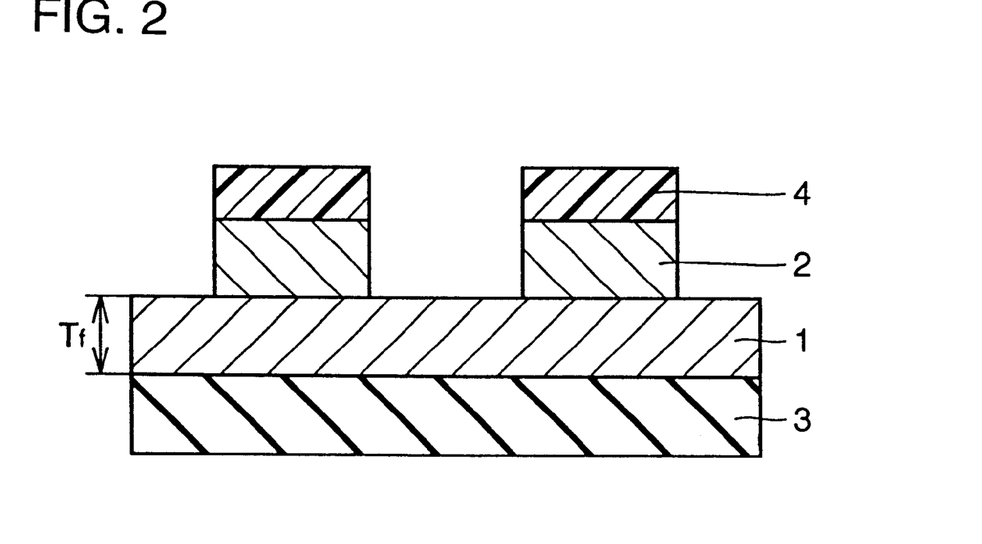

As seen in FIG. 2, second conductive film 2 is etched and thus patterned at least until the surface of first conductive film 1 is exposed. Further, during this etching process, resist pattern 4 is also etched so that its thickness is somewhat reduced. Resist pattern 4, however, remains even after the patterning for second conductive film 2 is completed.

Thereafter, the etching of first conductive film 1 follows without removing the remaining resist pattern 4 by ashing.

One example of etching conditions for first conductive film 1 when the ICP-type etching device is used is as follows:

Etching gas and its flow rate: $Cl_2/BCl_3/CF_4$=80/20/20 sccm (sccm representing a volumetric flow ($cm^3$/min) in a normal state);
Normal pressure: 15 mTorr;
Source power: 1000 W; and
Bias power: 40 W.

With these etching conditions, the etch selectivity of first conductive film 1 to resist pattern 4 is approximately 0.5 to approximately 0.8, and the etch selectivity of second conductive film 2 to resist pattern 4 is approximately 30 to approximately 50.

Figure 3:
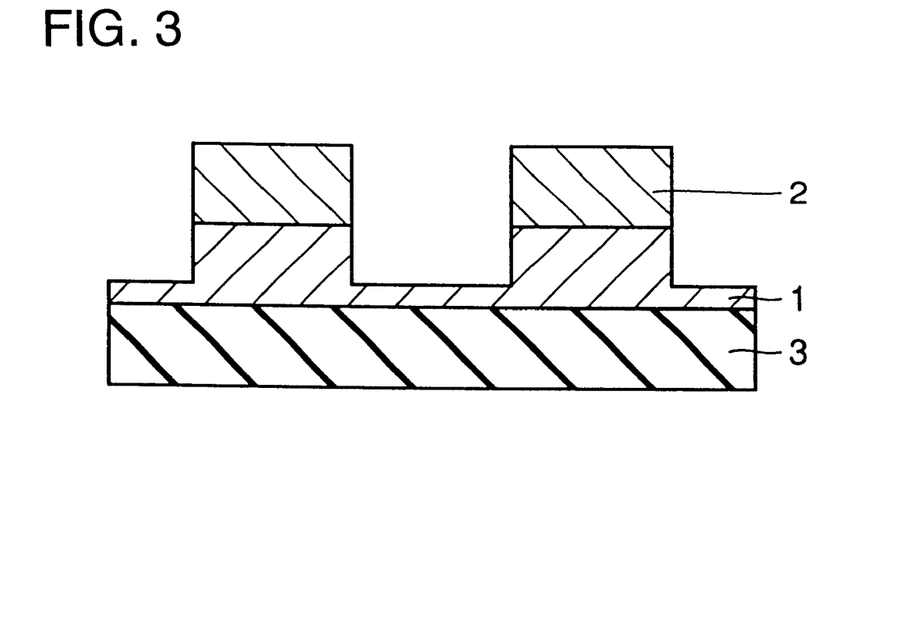
Figure 4:
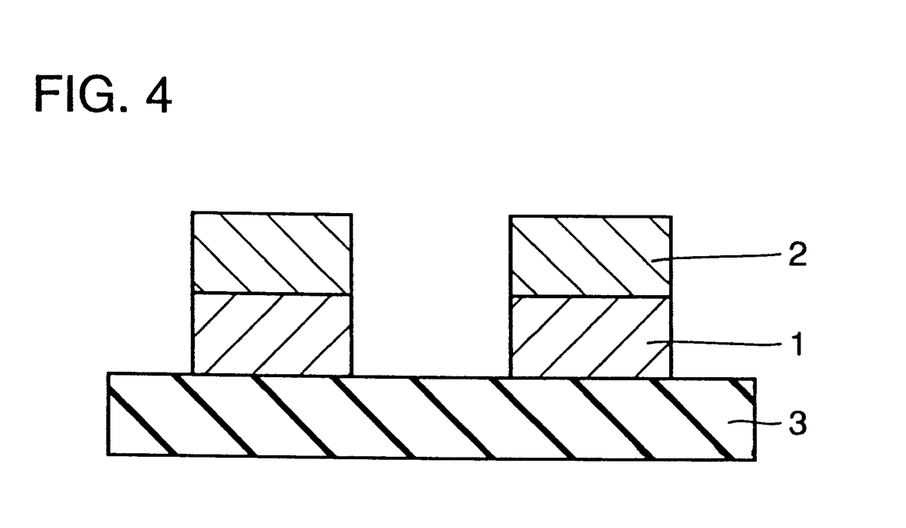

As seen in FIG. 3, resist pattern 4 is completely removed during the etching process for the patterning of first conductive film 1, and an upper surface of second conductive film 2 is exposed. Then, the etching process is continued using second conductive film 2 as a mask with the conditions given above. Thus, the patterning for first conductive film 1 is complete when the surface of insulating film 3 is finally exposed as seen in FIG. 4.

After resist pattern 4 is removed completely, second conductive film 2 serves as the mask for the patterning of first conductive film 1. In this case, since the etch selectivity of first conductive film 1 to second conductive film 2 is extremely large as described above, the etching process can be carried out while second conductive film 2 retains its shape as a mask. Therefore, first conductive film 1 can be patterned with a favorable result.

The thickness of resist pattern 4 (Tr: FIG. 1) in this embodiment is defined below.

The thickness Tr of resist pattern 4 is set such that $$Ts/S1 < Tr < Ts/S1 + Tf/S2$$

where Ts (FIG. 1) is the film thickness of second conductive film 2 when it is first formed, Tf (FIG. 2) is the film thickness of the portion of first conductive film 1 exposed upon the completion of the patterning of second conductive film 2, S1 is the etch selectivity of second conductive film 2 to resist pattern 4 in the etching conditions at the patterning of second conductive film 2, and S2 is the etch selectivity of first conductive film 1 to resist pattern 4 in the etching conditions at the patterning of first conductive film 1.

By setting the film thickness Tr of resist pattern 4 in the above-described manner, resist pattern 4 is completely removed in the midst of the patterning of first conductive film 1, as shown in FIGS. 2 and 3. Therefore, the upper surface of second conductive film 2 and first and second side surfaces forming a side surface of the pattern are processed not by ashing but by etching.

Although Ti or TiN as the material for first conductive film 1 and W as the material for second conductive film 2 are described in this embodiment, the description is non-limiting, and other materials may be used with the present invention.

In the first embodiment, the resist pattern is completely removed before the patterning of first conductive film 1 is completed, as shown in FIGS. 2 and 3 so that there is no need to remove the resist pattern 4 by ashing. Thus, the step of ashing to remove the resist pattern 4 can be eliminated, and the manufacturing steps are simplified.

In addition, the film thickness of resist pattern 4 is set so that resist pattern 4 will be completely removed by etching during the patterning of first conductive film 1. The thickness of the resist pattern here must be smaller than the thickness of the resist pattern in the conventional example in which the resist pattern remains even after the patterning of first conductive film 1. Since the film thickness of resist pattern 4 is set to be thinner than that in the conventional example, the increase in the aspect ratio of resist pattern 4 can be prevented. Therefore, the resist is kept from falling to the side and the pattern can be prevented from sticking together.

Moreover, since first conductive film 1 and second conductive film 2 are made of different materials, a large etch selectivity of first conductive film 1 to second conductive film 2 in the etching conditions for the patterning of first conductive film 1 is ensured. Consequently, second conductive film 2 functions as a mask even when resist pattern 4 is completely removed in the midst of the patterning of first conductive film 1. Thus, since second conductive film 2 retains its shape as a mask, first conductive film 1 can be patterned with a favorable result.

Second Embodiment

In the manufacturing method of the first embodiment, resist pattern 4 must be exposed to light beam when patterning resist pattern 4 as shown in FIG. 1. Upon resist pattern exposure, if the reflection of the exposure light beam from a film layer below resist pattern 4 is great, the accurate transfer of the pattern onto resist pattern 4 becomes impossible. In order to prevent such reflection, an anti-reflection film may be provided directly beneath resist 4. In the second embodiment, a method of forming an interconnection pattern for a semiconductor device in which the anti-reflection film is provided will be described.

Figure 5:
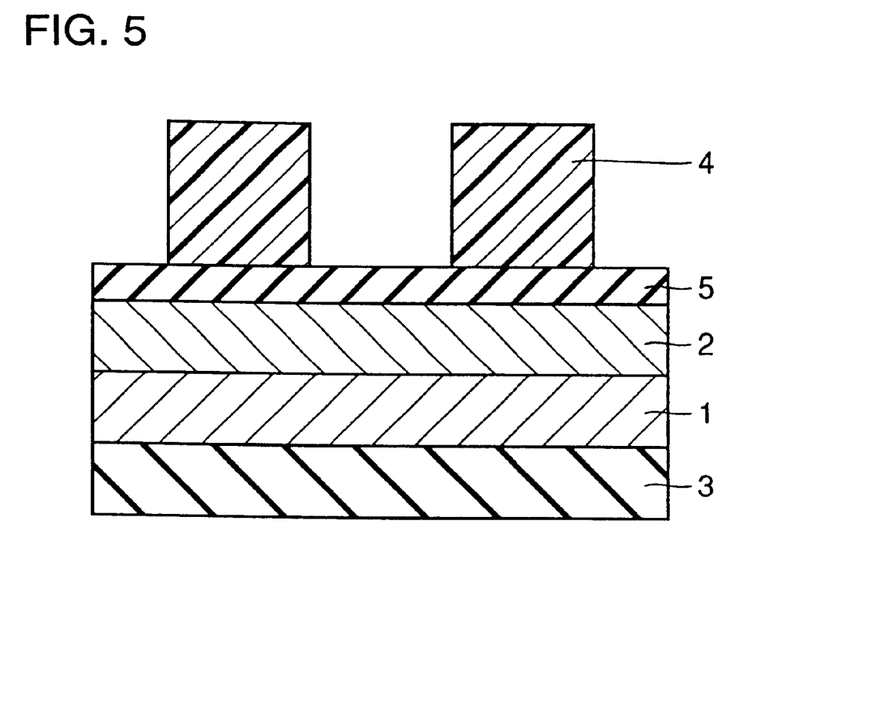
FIGS. 5 to 8 are schematic cross sectional views showing, in order, the steps involved in the method of forming an interconnection pattern for a semiconductor device according to the second embodiment of the present invention.

In FIG. 5, an insulating film 3, a first conductive film 1, and a second conductive film 2 of the same materials and thickness as those in the first embodiment are stacked in order. Thereafter, an anti-reflection film 5 made of an organic-type material, for example, is formed on second conductive film 2, and on second conductive film 2 a resist pattern 4 is formed by a common photolithographic technique. Anti-reflection film 5 is etched using resist pattern 4 as a mask.

Figure 6:
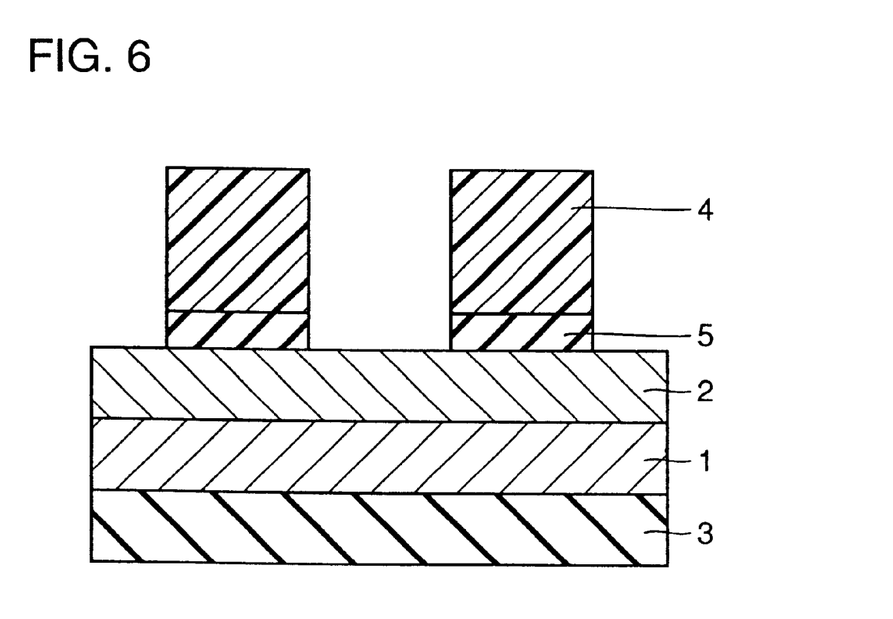

During this etching process, anti-reflection film 5 is patterned as seen in FIG. 6. Then, the etching for the patterning of second conductive film 2 is carried out using the same conditions as those of the first embodiment.

Figure 7:
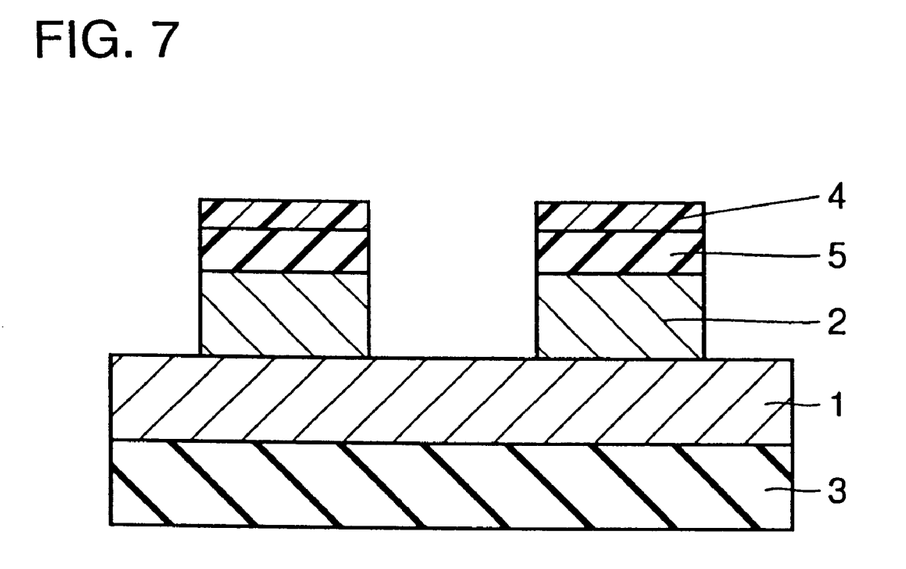
Figure 8:
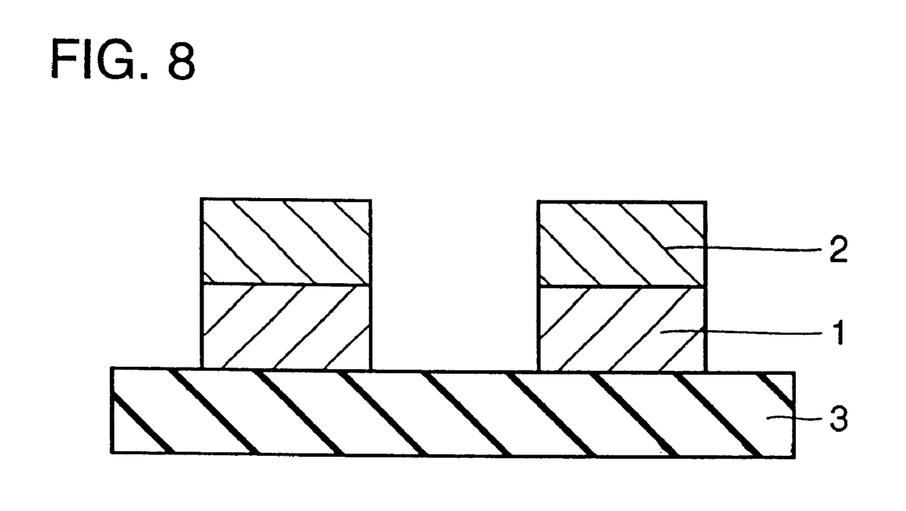

As seen in FIG. 7, second conductive film 2 is patterned by the etching and the surface of first conductive film 1 is exposed. Thereafter, the etching for the patterning of first conductive film 1 is carried out using the same conditions as those of the first embodiment. As in the first embodiment, resist pattern 4 and anti-reflection film 5 are completely removed during the patterning of first conductive film 1, and an upper surface of second conductive film 2 is exposed. Then, the etching for the patterning of first conductive film 1 is continued using second conductive film 2 as a mask, thereby exposing the surface of a first insulating film 3 as shown in FIG. 8, which completes the patterning of first conductive film 1.

The same effects as those obtained in the first embodiment are obtained in the second embodiment. In addition, anti-reflection film 5 provided beneath resist pattern 4 prevents the reflection of the exposure light beam from a layer below resist pattern 4, allowing an accurate transfer of pattern for resist 4.

Third Embodiment

In the third embodiment, the case in which the patterned stacked structure includes an insulating film will be described.

Figure 9:
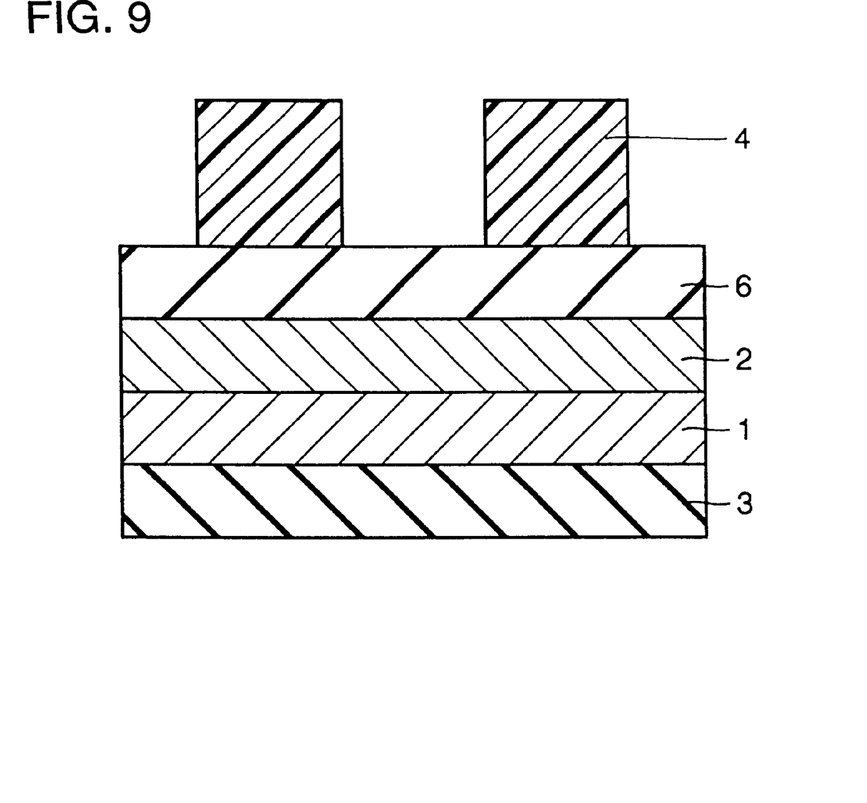
FIGS. 9 to 12 are schematic cross sectional views showing, in order, the steps involved in the method of forming an interconnection pattern for a semiconductor device according to the third embodiment of the present invention.

In FIG. 9, a first conductive film 1, a second conductive film 2, and a second insulating film 6 are stacked in this order on a first insulating film 3. Thereafter, a resist pattern 4 is formed on a prescribed region of second insulating film 6 by a common photolithographic technique. Here, a material which makes the etch selectivity of first conductive film 1 to second insulating film 6 in the etching conditions for the patterning of first conductive film 1 high is used for second insulating film 6. For instance, silicon nitride (SiN) is used for second insulating film 6, titanium (Ti) or titanium nitride (TiN) is used for first conductive film 1, and tungsten (W) is used for second conductive film 2.

While Ti and TiN are etched by a chlorine-type gas, SiN and W are etched by a fluorine-type gas so that the etch selectivity of first conductive film 1 to second insulating film 6 in the etching conditions for the patterning of first conductive film 1 can be made as high as about 30 to about 50. Moreover, as in the conventional example, first conductive film 1 is formed as barrier metal, and second conductive film 2 is formed as a main electrical conduction film. First insulating film 3 is formed, for example, of silicon oxide ($SiO_2$) or the like. As to the film thickness, for instance, first insulating film 3 is 100 nm, first conductive film 1 is 100 nm, second conductive film 2 is 100 nm, second insulating film 6 is 50 nm, and resist pattern 4 is 250 nm in thickness. Here, the film thickness for resist pattern 4 is chosen such that resist pattern 4 is removed completely during etching for the patterning of first conductive film 1, as in the first embodiment described above.

Second insulating film 6 is etched using resist pattern 4 as a mask. One example of the etching conditions for second insulating film 6 when the ICP-type etching device is used is as follows:

Etching gas and its flow rate: $SF_6/N_2/CF_4$=90/10/20 sccm (sccm representing a volumetric flow ($cm^3$/min) in a normal state);

Normal pressure: 15 mTorr;

Source power: 1000 W; and

Bias power: 40 W.

With these etching conditions, the etch selectivity of second insulating film 6 to resist pattern 4 is approximately 1 to approximately 1.5.

Figure 10:
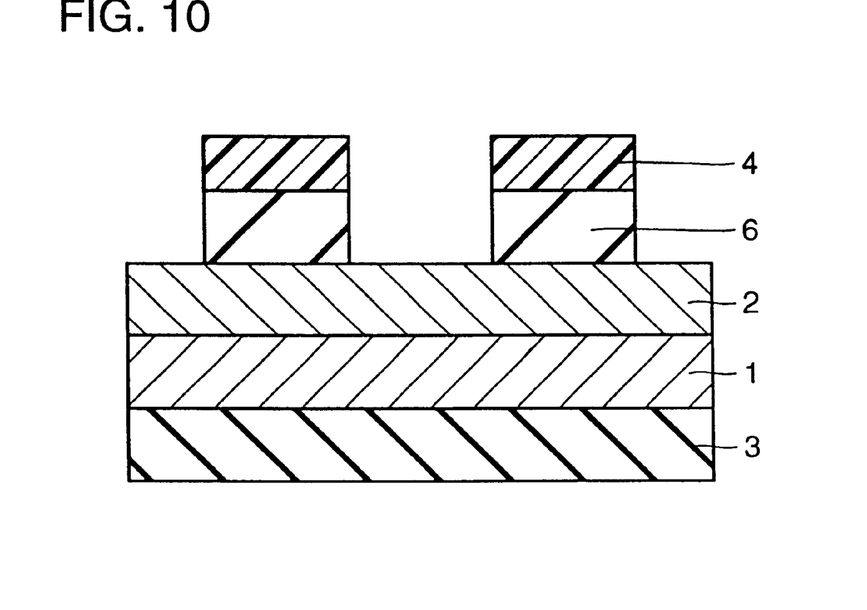

As seen in FIG. 10, second insulating film 6 is patterned by the etching and a portion of the surface of second conductive film 2 is exposed. At this time, resist pattern 4 remains on second insulating film 6.

Thereafter, the etching for the patterning of second conductive film 2 follows without removing resist pattern 4 that remains from the prior step. The etching conditions for second conductive film 2 can be the same as those for second insulating film 6.

Figure 11:
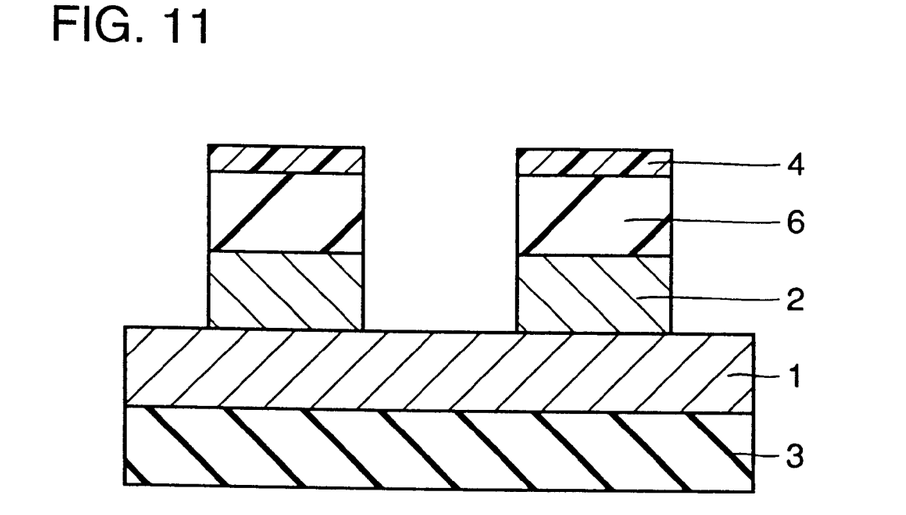

As seen in FIG. 11, second conductive film 2 is patterned by etching and the surface of first conductive film 1 is exposed. In this condition, resist pattern 4 still remains on second insulating film 6. Thereafter, the etching for the patterning of first conductive film 1 is carried out without removing resist pattern 4. One example of etching conditions for first conductive film 1 when the ICP-type etching device is used is as follows:

Etching gas and its flow rate: $Cl_2/BCl_3/CF_4$=80/20/20 sccm (sccm representing a volumetric flow ($cm^3$/min) in a normal state);

Normal pressure: 15 mTorr;

Source power: 1000 W; and

Bias power: 40 W.

With these etching conditions, the etch selectivity of first conductive film 1 to resist pattern 4 is approximately 0.5 to approximately 0.8, and the etch selectivity of second insulating film 6 to resist pattern 4 is approximately 30 to approximately 50.

Figure 12:
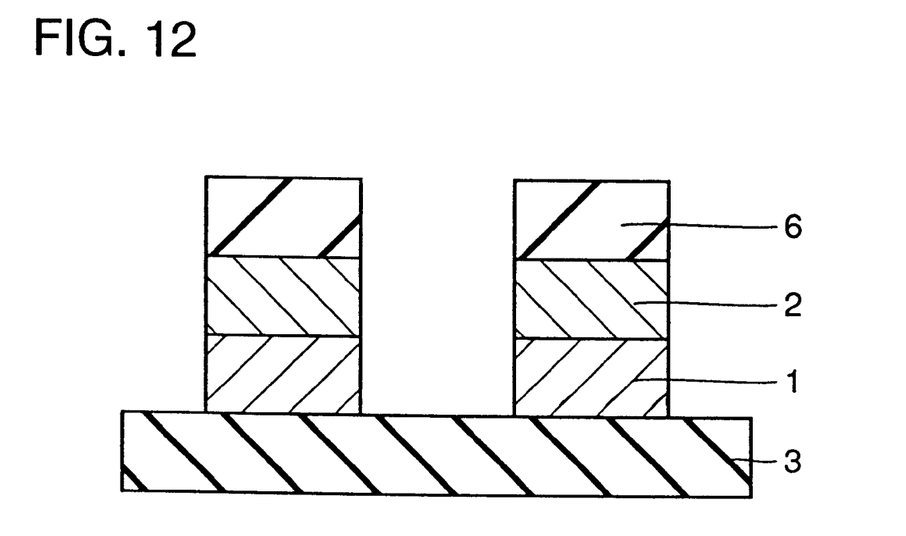

As a result of the above-described etching, first conductive film 1 is patterned, resist pattern 4 is completely removed before the patterning is completed, and the surface of second insulating film 6 is exposed. Then, the etching of first conductive film 1 is continued using second insulating film 6 as a mask, and the patterning of first conductive film 1 is complete when the surface of first insulating film 3 is finally exposed as seen in FIG. 12.

After the resist pattern is removed completely, second insulating film 6 serves as the mask for the patterning of first conductive film 1. In this case, since it is possible to make the etch selectivity of first conductive film 1 to second insulating film 6 extremely large as described above, second insulating film 6 retains its shape as a mask during the patterning of first conductive film 1. Therefore, first conductive film 1 can be patterned with a favorable result.

In the second embodiment, as in the first embodiment, resist pattern 4 is completely removed by etching before the patterning of first conductive film 1 is completed so that the step of ashing to remove resist pattern 4 can be eliminated, thereby simplifying the manufacturing steps.

Moreover, since the film thickness of resist pattern 4 can be made thinner than the film thickness of the resist in a conventional example, the resist is kept from falling to the side and the pattern can be prevented from sticking together.

Furthermore, since first conductive film 1 and second insulating film 6 are made of different materials, second insulating film 6 functions as a mask during the patterning of first conductive film 1. Thus, first conductive film 1 can be patterned with a favorable result.

Fourth Embodiment

In the fourth embodiment, the case in which an anti-reflection film similar to the one used in the second embodiment is provided in forming the pattern having a stacked structure of the third embodiment will be described.

Figure 13:
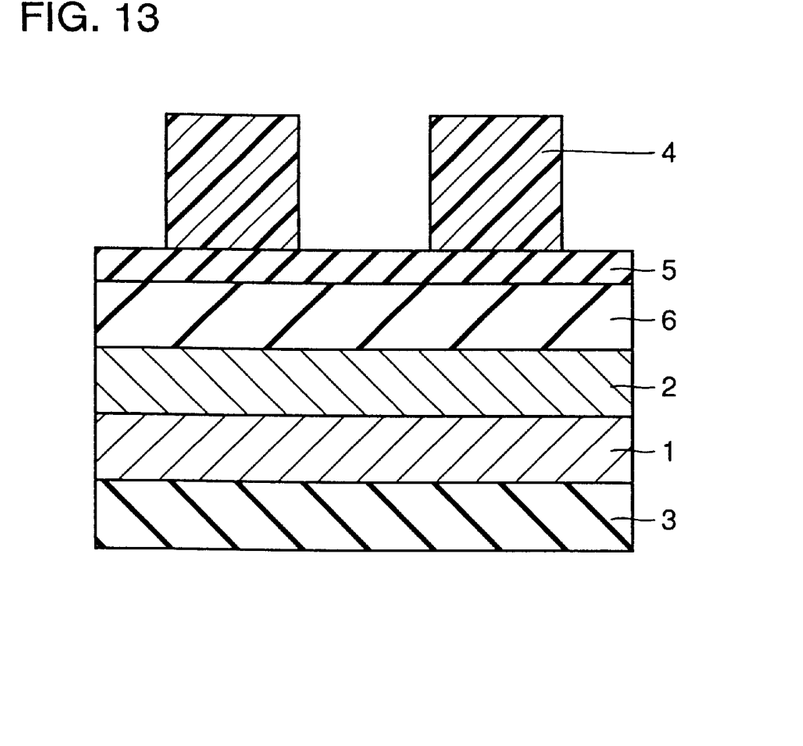
FIGS. 13 to 17 are schematic cross sectional views showing, in order, the steps involved in the method of forming an interconnection pattern for a semiconductor device according to the fourth embodiment of the present invention.

In FIG. 13, a first insulating film 3, a first conductive film 1, a second conductive film 2, and a second insulating film 6 of the same materials and thickness as those in the third embodiment are stacked in order. Thereafter, an anti-reflection film 5 made of an organic-type material, for example, is formed on second insulating film 6, and on second insulating film 6 a resist pattern 4 is formed by a common photolithographic technique. Anti-reflection film 5 is etched using resist pattern 4 as a mask.

Figure 14:
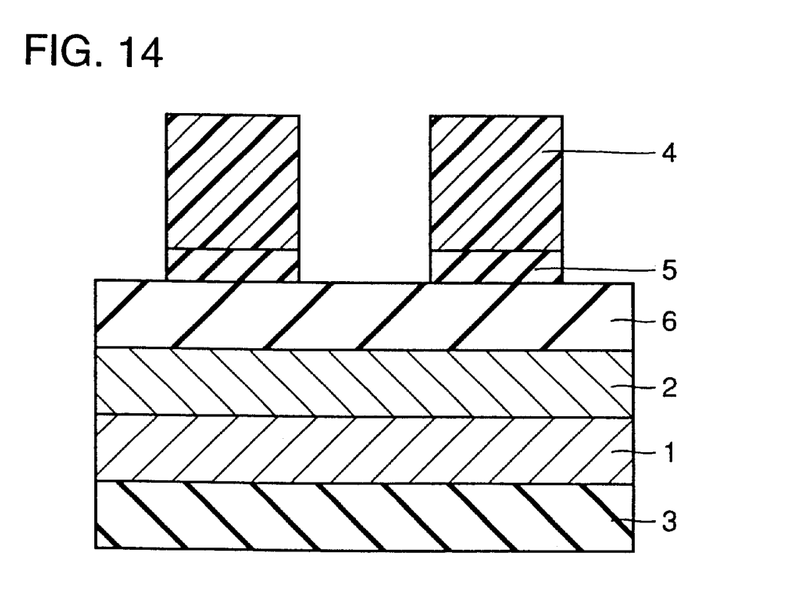

During this etching process, anti-reflection film 5 is patterned as seen in FIG. 14. Then, the etching for the patterning of second insulating film 6 is carried out using the same conditions as those of the third embodiment.

Figure 15:
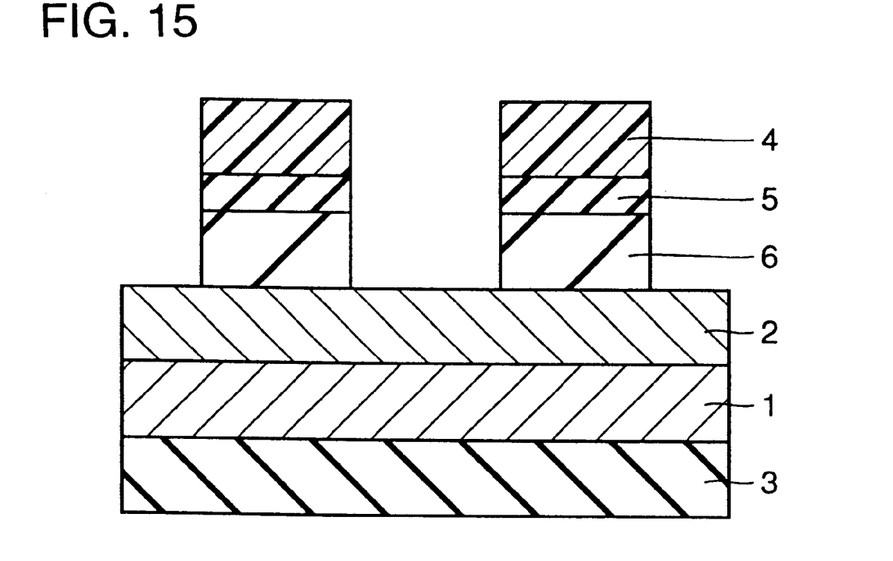

As seen in FIG. 15, second insulating film 6 is patterned by the etching and the surface of second conductive film 2 is exposed. Thereafter, the etching for the patterning of second conductive film 2 is carried out using the same conditions as those of the third embodiment.

Figure 16:
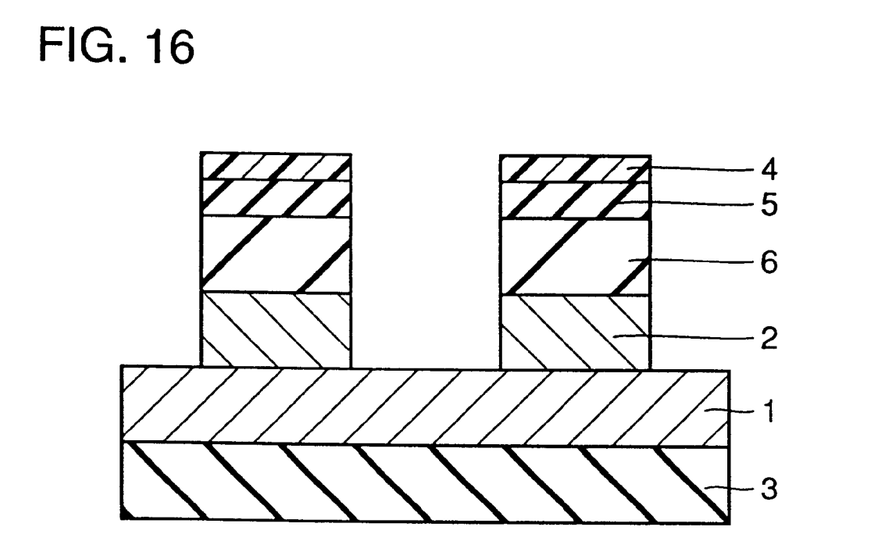

As seen in FIG. 16, second conductive film 2 is patterned by etching and the surface of first conductive film 1 is exposed. At this time, anti-reflection film 5 and resist pattern 4 still remain on second insulating film 6. The etching for the patterning of first conductive film 1 is carried out without removing anti-reflection film 5 and resist pattern 4 using the same conditions as those in the third embodiment.

Figure 17:
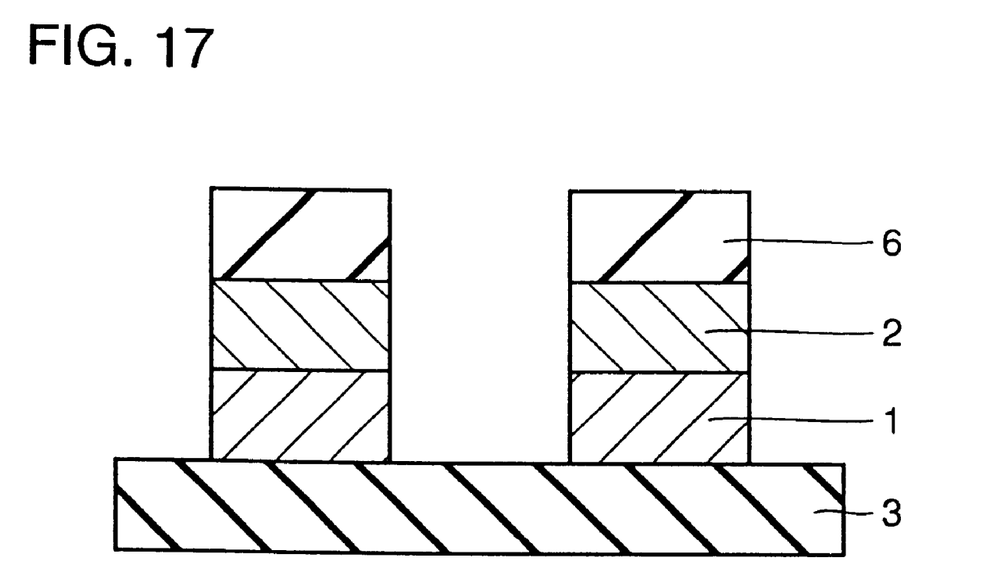

Resist pattern 4 and anti-reflection film 5 are completely removed during the patterning of first conductive film 1, and an upper surface of second insulating film 6 is exposed. Then, the etching for the patterning of first conductive film 1 is continued using second insulating film 6 as a mask. Thus, the surface of a first insulating film 3 is exposed as shown in FIG. 17, which completes the patterning of first conductive film 1.

The same effects as those obtained in the first embodiment are obtained in the fourth embodiment. In addition, anti-reflection film 5 provided beneath resist pattern 4 prevents the reflection of the exposure light beam from a layer below resist pattern 4, allowing an accurate transfer of pattern for resist 4.

Figure 18:
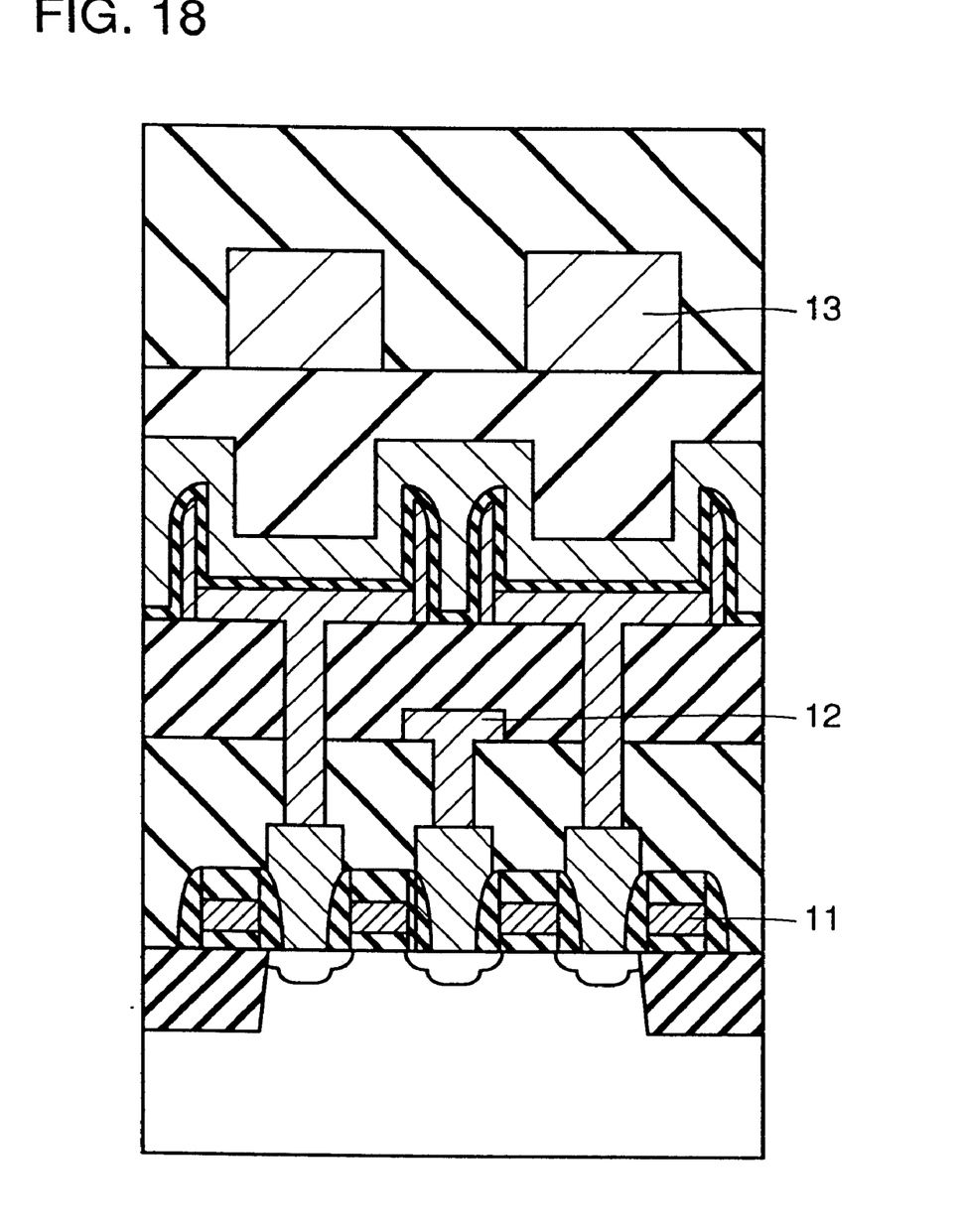
FIG. 18 is a diagram relating to the portion using the stacked films patterned using the method of forming an interconnection pattern for a semiconductor device according to the present invention.

The interconnection layer to be patterned in the above-described first to fourth embodiments refer, for example, to portions used for a gate electrode layer 11, a bit line 12, an interconnection 13 in a layer above gate electrode layer 11 or bit line 12, or the like shown in a DRAM (Dynamic Random Access Memory) as shown in FIG. 18.

Moreover, although the interconnection pattern is described in terms of a pattern of stacked films in the first to fourth embodiments, the description is non-limiting. The pattern of stacked films may be formed by stacked insulating layers.

Furthermore, although the combination of two layers of conductive films 1 and 2 or the combination of two layers of conductive films 1 and 2 and a single layer of insulating film 6 is described as the stacked films to be patterned, the combinations of a conductive film and an insulating film are not limited to these examples.

In addition, the stacked films are not limited to two layers or three layers, and may include four or more layers.

Further, the materials of first and second conductive films 1 and 2 are not limited to the above-described materials, and may be other materials as long as first conductive film 1 and second conductive film 2 are made of different materials, and a high etch selectivity is ensured.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, comprising the steps of:
    forming a semiconductor substrate having a main surface;
    stacking a first conductive film and a second conductive film made of different conductive materials in this order on the main surface of said semiconductor substrate;
    forming a resist pattern on said second conductive film;
    patterning said second conductive film by etching using said resist pattern as a mask to expose a surface of said firms conductive film selectively, while leaving said resist pattern on said second conductive film which is patterned; and
    etching said first conductive film being exposed and removing said resist pattern completely by etching of said firm conductive film before patterning of said first conductive film is completed.

2. A method of forming a pattern for a semiconductor device, comprising the steps of:
    stacking a first conductive film and a second conductive film made of different conductive materials in this order;

forming a resist pattern on said second conductive film;

patterning said second conductive film by etching using said resist pattern as a mask to expose a surface of said first conductive film selectively, while leaving said resist pattern on said second conductive film which is patterned; and etching said first conductive film being exposed and removing said resist pattern completely by etching of said firm conductive film before patterning of said first conductive film is completed.

3. The method of forming a pattern for a semiconductor device according to claim 2, wherein etch selectivity of said first conductive film to said second conductive film in patterning conditions for said first film is at least 30.

4. A method of forming a pattern for a semiconductor device, comprising the steps of:

stacking a first film and a second film made of different materials in this order;

forming an anti-reflective film on said second film;

forming a resist pattern on said anti-reflective film;

patterning said anti-reflective film and said second film by etching using said resist pattern as a mask to expose a surface of said first film selectively, while leaving said resist pattern and said anti-reflective film on said second film which is patterned;

etching said first film being exposed and removing said resist pattern and said anti-reflective film completely by etching of said first film before completion of patterning of said first film.

5. A method of forming a pattern for a semiconductor device, comprising the steps of:

stacking a first film and a second film made of different materials in this order;

forming a third film, made of a material different from materials of the first and second film, on the second film;

forming a resist pattern on said third film;

patterning said third film by etching using said resist pattern as a mask to expose a surface of said second film selectively, while leaving said resist pattern on said third film which is patterned;

patterning said second film by etching using said resist pattern and said third film as a mask to expose a surface of said first film selectively while, leaving said third film and said resist pattern on said second film which is patterned; and etching said first film being exposed and removing said resist pattern completely by etching of said first film before patterning of said first film is completed.

6. The method of forming a pattern for a semiconductor device according to claim 5, wherein etch selectivity of said first film to said third film in patterning conditions for said first film is at least 30.

7. The method of forming a pattern for a semiconductor device according to claim 5, wherein said third film is an insulating film.

8. A method of forming a pattern for a semiconductor device, comprising the steps of:

stacking a first film and a second film made of different materials in this order;

forming a third film, made of a material different from materials of the first and second films, on the second film;

forming an anti-reflection film on the third film;

forming a resist pattern on the anti-reflection film;

patterning said anti-reflection film by etching using said resist pattern as a mask to expose a surface of said third film selectively, while leaving said photoresist pattern on said anti-reflection film which is patterned;

patterning said third film by etching using said resist pattern and said anti-reflection film as a mask to expose a surface of said second film selectively while leaving said third film, anti-reflection film and resist pattern on said third film which is patterned;

patterning said second film by etching using said third film, anti-reflection film and resist pattern as a mask to expose a surface of said first film selectively, while leaving said second film, third film, anti-reflection film, and resist pattern on said first film which is patterned; and etching said first film being exposed and removing said resist pattern completely by etching of said first film before patterning of said first film is completed.

9. A method of forming a pattern for a semiconductor device, comprising the steps of:

stacking a first film and a second film made of different materials in this order;

forming a resist pattern on said second film;

patterning said second film by etching using said resist pattern as a mask to expose a surface of said first film selectively while leaving said resist pattern on said second film which is patterned; and etching said first film being exposed and removing said resist pattern completely by etching of said first film before patterning of said first film is completed, wherein said first and second films are conductive films.

10. A method of forming a pattern for a semiconductor device, comprising the steps of:

stacking a first film and a second film made of different materials in this order;

forming a resist pattern on said second film, patterning said second film by etching using said resist pattern as a mask to expose a surface of said first film selectively, while leaving said resist pattern on said second film which is patterned; and etching said first film being exposed and removing said resist pattern completely by etching of said first film before patterning of said first film is completed, wherein thickness Tr of said resist pattern formed is set such that $$Ts/S1 < Tr < Ts/S1 + Tf/S2$$

where Ts is a film thickness of said second film when it is first formed, Tf is a film thickness of a portion of said first film exposed upon completion of pattering of said second film, S1 is etch selectivity of said second film to said resist pattern in etching conditions at patterning of said second film, and S2 is etch selectivity of said first film to said resist pattern in etching conditions at patterning of said first film.

* * * * *

UNITED STATES PATENT AND TRADEMARK OFFICE
CERTIFICATE OF CORRECTION

PATENT NO.     : 6,287,752 B1
DATED          : September 11, 2001
INVENTOR(S)    : Kazunori Yoshikawa It is certified that error appears in the above-identified patent and that said Letters Patent is hereby corrected as shown below:

<u>Column 10, claim 1,</u>
Line 55, change "firm" to -- first --

Signed and Sealed this

Ninth Day of April, 2002

Attest:

JAMES E. ROGAN
*Director of the United States Patent and Trademark Office*

*Attesting Officer*